US010038380B2

(12) United States Patent
Hashimoto et al.

(10) Patent No.: US 10,038,380 B2
(45) Date of Patent: Jul. 31, 2018

(54) APPARATUS FOR CONTROLLING INSULATING GATE-TYPE SEMICONDUCTOR ELEMENT, AND POWER CONVERSION APPARATUS USING APPARATUS FOR CONTROLLING INSULATING GATE-TYPE SEMICONDUCTOR ELEMENT

(71) Applicant: HITACHI, LTD., Chiyoda-ku, Tokyo (JP)

(72) Inventors: Takayuki Hashimoto, Tokyo (JP); Mutsuhiro Mori, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/699,274

(22) Filed: Sep. 8, 2017

(65) Prior Publication Data
US 2017/0373599 A1    Dec. 28, 2017

Related U.S. Application Data

(63) Continuation of application No. 14/889,850, filed as application No. PCT/JP2013/063102 on May 10, 2013, now Pat. No. 9,780,660.

(51) Int. Cl.
*H02M 3/158* (2006.01)
*H02M 1/32* (2007.01)
(Continued)

(52) U.S. Cl.
CPC .......... *H02M 3/158* (2013.01); *H01L 29/786* (2013.01); *H02M 1/00* (2013.01); *H02M 1/32* (2013.01);
(Continued)

(58) Field of Classification Search
CPC .......... H02M 2001/0009; H02M 1/32; H02M 3/158; H02M 2001/325; H02M 1/00;
(Continued)

(56) References Cited

U.S. PATENT DOCUMENTS

| 5,038,081 A | 8/1991 | Maiale |
| 5,459,339 A | 10/1995 | Sakurai et al. |

(Continued)

FOREIGN PATENT DOCUMENTS

| EP | 0568353 A1 | 11/1993 |
| JP | 3-195212 A | 8/1991 |

(Continued)

OTHER PUBLICATIONS

International Search Report from International Patent Application No. PCT/JP2013/063102, dated Jun. 11, 2013.

(Continued)

*Primary Examiner* — Gustavo Rosario Benitez
(74) *Attorney, Agent, or Firm* — Miles & Stockbridge P.C.

(57) ABSTRACT

An apparatus is adapted to drive an insulating gate-type semiconductor element by a first control voltage and a second control voltage, that are supplied to a first insulating gate and a second insulating gate, respectively, and includes a first noise filter inputting a signal about current that passes through the insulating gate-type semiconductor element, a first comparator making a comparison between an output signal of the first noise filter and a first reference signal and outputting a first comparison result, a first control voltage output circuit, and a second control voltage output circuit, the second control voltage output circuit being adapted to reduce the second control voltage when it is determined from the first comparison result that overcurrent passes through the insulating gate-type semiconductor element, the (Continued)

first control voltage output circuit being adapted to reduce the first control voltage after the second control voltage is reduced.

20 Claims, 15 Drawing Sheets

(51) Int. Cl.
| | | |
|---|---|---|
| *H03K 17/16* | (2006.01) | |
| *H01L 29/786* | (2006.01) | |
| *H02M 1/00* | (2006.01) | |
| *H03K 17/082* | (2006.01) | |

(52) U.S. Cl.
CPC ....... *H03K 17/0828* (2013.01); *H03K 17/168* (2013.01); *H02M 2001/0009* (2013.01); *H03K 2217/0036* (2013.01)

(58) Field of Classification Search
CPC ...... H03K 17/08; H03K 17/56; H03K 17/693; H03K 17/0828; H03K 17/567; H03K 17/081; H03K 17/0812; H03K 17/0814; H03K 17/082; H03K 17/168; H03K 2217/0036; H01L 29/739; H01L 29/786; H01L 29/78; H01L 29/66325
See application file for complete search history.

(56) References Cited

U.S. PATENT DOCUMENTS

| | | | |
|---|---|---|---|
| 5,561,393 | A | 10/1996 | Sakurai et al. |
| 6,153,495 | A | 11/2000 | Kub et al. |
| 6,194,290 | B1 | 2/2001 | Kub et al. |
| 6,274,892 | B1 | 8/2001 | Kub et al. |
| 6,288,597 | B1 | 9/2001 | Hasegawa |
| 6,717,785 | B2 | 4/2004 | Fukuda |
| 8,687,327 | B2 | 4/2014 | Watanabe |
| 2001/0007252 | A1* | 7/2001 | Ito ........................... F02P 3/053 123/630 |
| 2005/0161768 | A1 | 7/2005 | Sugiyama et al. |
| 2006/0202308 | A1 | 9/2006 | Sugiyama et al. |
| 2009/0057832 | A1 | 3/2009 | Kouno |
| 2009/0128974 | A1 | 5/2009 | Ishikawa |
| 2011/0228433 | A1 | 9/2011 | Tsai |
| 2012/0075753 | A1 | 3/2012 | Watanabe et al. |
| 2012/0153719 | A1 | 6/2012 | Inaba |
| 2013/0082627 | A1 | 4/2013 | Ichikawa |
| 2013/0257177 | A1 | 10/2013 | Jacobson |
| 2014/0085762 | A1 | 3/2014 | Shimano |
| 2014/0118872 | A1 | 5/2014 | Pang |

FOREIGN PATENT DOCUMENTS

| | | |
|---|---|---|
| JP | 6-125256 A | 5/1994 |
| JP | 2000-101076 A | 4/2000 |
| JP | 2001-320049 A | 11/2001 |
| JP | 2002-507058 A | 3/2002 |
| JP | 2005-191221 A | 7/2005 |
| JP | 2008-141390 A | 6/2008 |
| JP | 2008-305956 A | 12/2008 |
| JP | 2010-74051 A | 4/2010 |
| JP | 2010-123667 A | 6/2010 |
| JP | 2010-251517 A | 11/2010 |

OTHER PUBLICATIONS

Office Action dated Jun. 30, 2017 for related Chinese Application No. 2013-380076459.3.

Office Action dated Nov. 22, 2016 for related Japanese Patent Application No. 2015-515718.

\* cited by examiner

APPARATUS FOR CONTROLLING INSULATING GATE-TYPE SEMICONDUCTOR ELEMENT, AND POWER CONVERSION APPARATUS USING APPARATUS FOR CONTROLLING INSULATING GATE-TYPE SEMICONDUCTOR ELEMENT

TECHNICAL FIELD

The present invention relates to an apparatus for controlling an insulating gate-type semiconductor element and a power conversion apparatus using the apparatus for controlling the insulating gate-type semiconductor element and, more particularly, to an apparatus for controlling an insulating gate-type semiconductor element and a power conversion apparatus using the apparatus for controlling the insulating gate-type semiconductor element which are suitable for articles, including low power equipment to high power equipment, which are widely used.

BACKGROUND ART

In recent power conversion apparatuses for saved energy and new energy, many inverters and converters are used. In order to realize a low carbon society, considerable spread of them becomes essential.

As a power semiconductor element for a power conversion apparatus, an insulated gate bipolar transistors (hereinafter referred to as "IGBT") has been widely used. The IGBT has the excellent property of being low in an on-state voltage and high in switching speed, that is, being low in both of a conduction loss and a switching loss, as an element for a power conversion apparatus. Moreover, the IGBT also has easy controllability by an insulating gate, so that it has been currently used widely in articles including low power equipment, such as an air-conditioner and a microwave oven, to high power equipment, such as an inverter for a railway and an iron factory.

According to the spread of the power conversion apparatuses, further improvement in performance of the IGBT is required. However, there is trade-off relation between the conduction loss and the switching loss, so that considerable improvement in the performance of the IGBT is difficult.

Thus, as technologies that reduce both of the conduction loss and switching loss of the IGBT, there have been known a structure in which an insulating gate electrode is divided into a plurality of sections that are controlled independently (refer to Patent Literature 1, 2, and 3, for example), and a structure in which an insulating gate electrode is provided on a back surface (collector side) (refer to Patent Literature 4, 5, 6, and 8, for example).

The structure, in which the gate electrode is divided into the plurality of sections, and the structure, in which the insulating gate electrode is provided on the back surface, can respectively take two modes, that includes a mode low in an on-voltage, viz., a mode large in a turn-off loss, and a mode high in the on-voltage, viz., a mode small in the turn-off loss, by a second gate electrode on a front surface and the gate electrode on the back surface. At the time of conduction and turn-off, the two states are switched, thereby making it possible to reduce both or the conduction loss and switching loss

CITATION LIST

Patent Literature

Patent Literature 1: Japanese Patent Application Laid-Open No. 2000-101076

Patent Literature 2: Japanese Patent Application. Laid-Open No. 2005-191221

Patent Literature 3: Japanese Patent Application Laid-Open No. 2008-305956

Patent Literature 4: Japanese Patent Application Laid-Open No. 2001-320049

Patent Literature 5: Japanese Patent Application Laid-Open No. 2010-123667

Patent Literature 6: Japanese Patent Application Laid-Open No. 2010-251517

Patent Literature 7: Japanese Patent Application Laid-Open No. 2002-507058

Patent Literature 8: Japanese Patent Application Laid-Open No. 2010-74051

SUMMARY OF THE INVENTION

Technical Problem

As described above, various technologies for the element structure of the insulating gate-type semiconductor element, such as the IGBT provided with the plurality of insulating gates, have been known. However, a control technology and a drive technology for it are in the process of development. In particular, for reliability of a power conversion apparatus, a technology for protecting a power semiconductor element from overcurrent at the time of abnormality such as power source short-circuit is important. Though Patent Literature 1 discloses that a circuit that detects the overcurrent at the time of the short circuit and the like is provided, and one insulating gate is turned off at the time of short circuit. However, a concrete apparatus configuration has not been realized yet.

Therefore, the object of the present invention is to provide a control apparatus which has a function of protecting an insulating gate-type semiconductor element provided with a plurality of insulating gates from overcurrent.

Solution to Problem

An apparatus for controlling an insulating gate-type semiconductor element, according to the present invention, drives an insulating gate-type semiconductor element with a first insulating gate and a second insulating gate by a first control voltage and a second control voltage which are supplied to the first insulating gate and the second insulating gate, respectively. Moreover, the apparatus for controlling the insulating gate-type semiconductor element, according to the present invention, includes a first noise filter inputting a signal about current that passes through the insulating gate-type semiconductor element, a first comparator making a comparison between an output signal of the first noise filter and a first reference signal and outputting a first comparison result, a first control voltage output circuit, and a second control voltage output circuit, the second control voltage output circuit being adapted to reduce the second control voltage when it is determined from the first comparison result that overcurrent passes through the insulating gate-type semiconductor element, the first control voltage output circuit being adapted to reduce the first control voltage after the second control voltage drops.

Here, as the insulating gate-type semiconductor element, there may be employed an insulating gate bipolar transistor (IGBT) in which a first insulating gate and a second insulating gate are a primary gate and an auxiliary gate, respectively.

According to the control apparatus of the present invention, when overcurrent passes through the insulating gate-type semiconductor element, the second insulating gate is turned off at first, whereby saturation current of the insulating gate-type semiconductor element is reduced and a short-circuit capacity is increased, so that when the first insulating gate is turned off, the current that passes through the insulating gate-type semiconductor element can be securely blocked.

Advantageous Effect of Invention

According to the present invention, it is possible to realize a control apparatus which has a function of protecting an insulating gate-type semiconductor element provided with a plurality of insulating gates from overcurrent. Thereby, reliability of a power conversion apparatus employing an insulating gate-type semiconductor element that is provided with a plurality of insulating gates is improved.

DESCRIPTION OF EMBODIMENTS

Embodiments of the present invention will be explained hereinafter with reference to the drawings.

Embodiment 1

Figure 1:
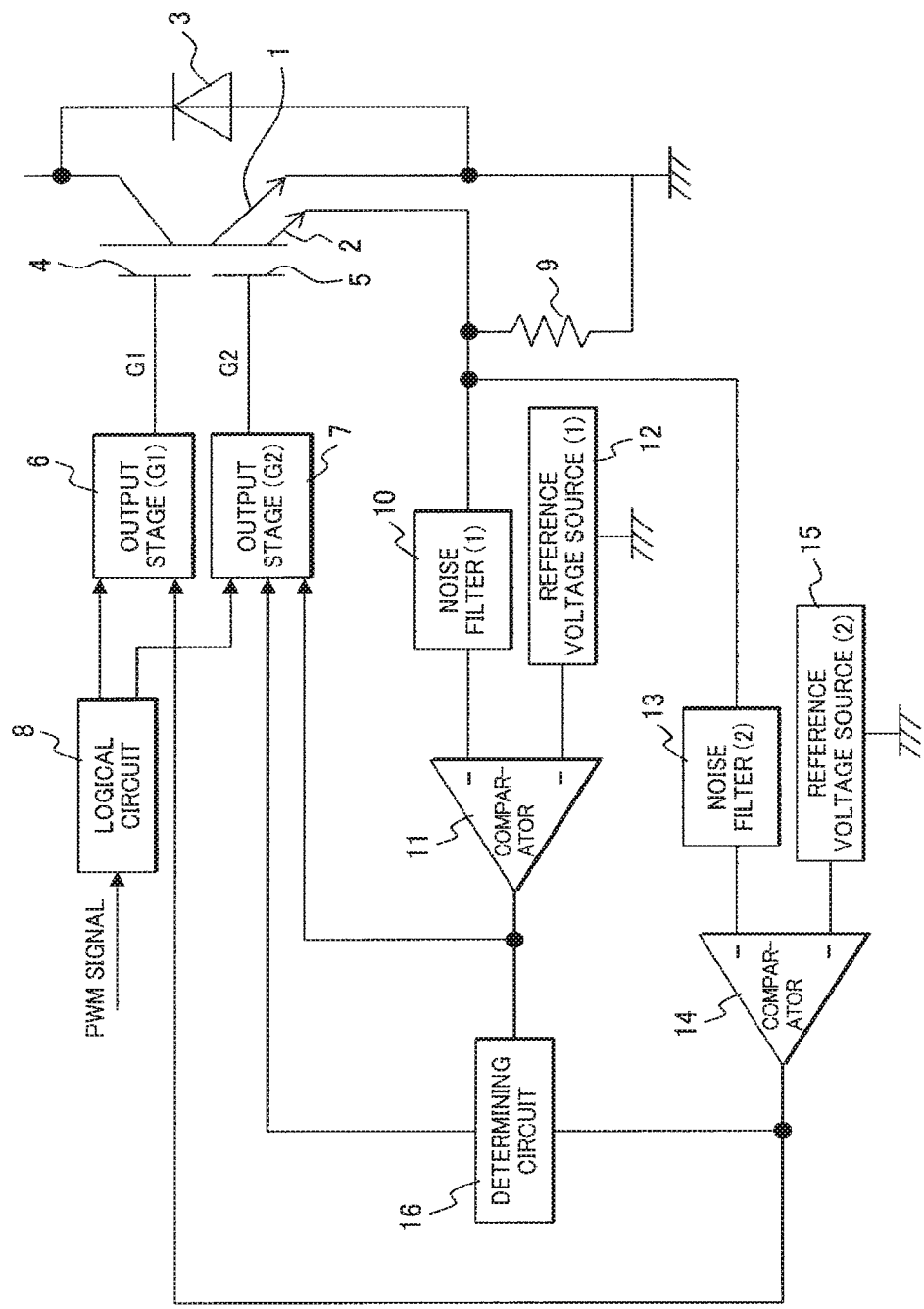
FIG. 1 is a circuit block diagram of an apparatus for controlling an insulating gate-type semiconductor element, according to a first embodiment of the present invention.

FIG. 1 is a circuit block diagram of an apparatus for controlling an insulating gate-type semiconductor element, according to a first embodiment of the present invention. This embodiment includes an IGBT 1, a sense IGBT a diode 3, a primary gate (G1) 4, an auxiliary gate (G2) 5, an output stage 6 of a G1 drive circuit that is a first control voltage output circuit supplying a first control voltage to the G1, an output stage 7 of a G2 drive circuit that is a second control voltage output circuit supplying a second control voltage to the G2, a logical circuit 8 receiving a PWM signal and outputting control signals of the G1 and G2, a sense resistor 9, a first noise filter 10, a first comparator 11, a first reference voltage source 12, a second noise filter 13, a second comparator 14, a second reference voltage source 15, and a determining circuit 16 returning the auxiliary gate (G2) 5 to an on-state if an-off signal that is a second comparison result is not outputted from the second comparator after an off-signal that is a first comparison result is outputted from the first comparator. In this embodiment, the time constant of the second noise filter 13 is larger than the time constant of the first noise filter 10.

The IGBT 1 and the IGBT 2 are formed on one semiconductor substrate and form a single semiconductor switching element, viz., an IGBT. As further concrete element structures, for example, the element structures that are disclosed in the above-mentioned Patent Literature 1 to 3 have been known.

Incidentally, if the time constant of the first noise filter 10 is zero, the first noise filter 10 may not be provided. In this case, voltages at both ends of the sense resistor 9 are inputted to the first comparator 11 without via any noise filter.

Primary operations of this embodiment are as follows:

(1) Overcurrent passes through the IGBT 1, voltages are generated at the both ends of the sense resistor 9, the output of the first noise filter 10 exceeds a reference voltage of the first reference voltage source 12, and the auxiliary gate (G2) 5 is turned off. Then, if the output of the second noise filter 13 exceeds a reference voltage of the second reference voltage source 15, the primary gate (G1) 4 is turned off and the IGBT 1 is turned off.

(2) Noise voltages are generated at the both ends of the sense resistor 9 and, if the output of the first noise filter 10 exceeds the reference voltage of the first reference voltage source 12, the auxiliary gate (G2) 5 is turned off. Then, unless the output of the second noise filter 13 exceeds the reference voltage of the second reference voltage source 15, the auxiliary gate (G2) 5 is returned to the on-state and the IGBT 1 returns to a normal on-state (state where on-signals are inputted to both of the G1 and G2).

(3) The noise voltages are generated at the both ends of the sense resistor 9 and, unless the output of the first noise filter 10 exceeds the reference voltage of the first reference voltage source 12, the on-state of the auxiliary gate (G2) 5 is maintained.

In the above-mentioned operation (1), the auxiliary gate (G2) 5 is turned off prior to turning-off of the primary care (G1) 4, whereby saturation current in the IGBT 1 is reduced and a short-circuit resistance is increased, so that reliability is improved.

Figure 2:
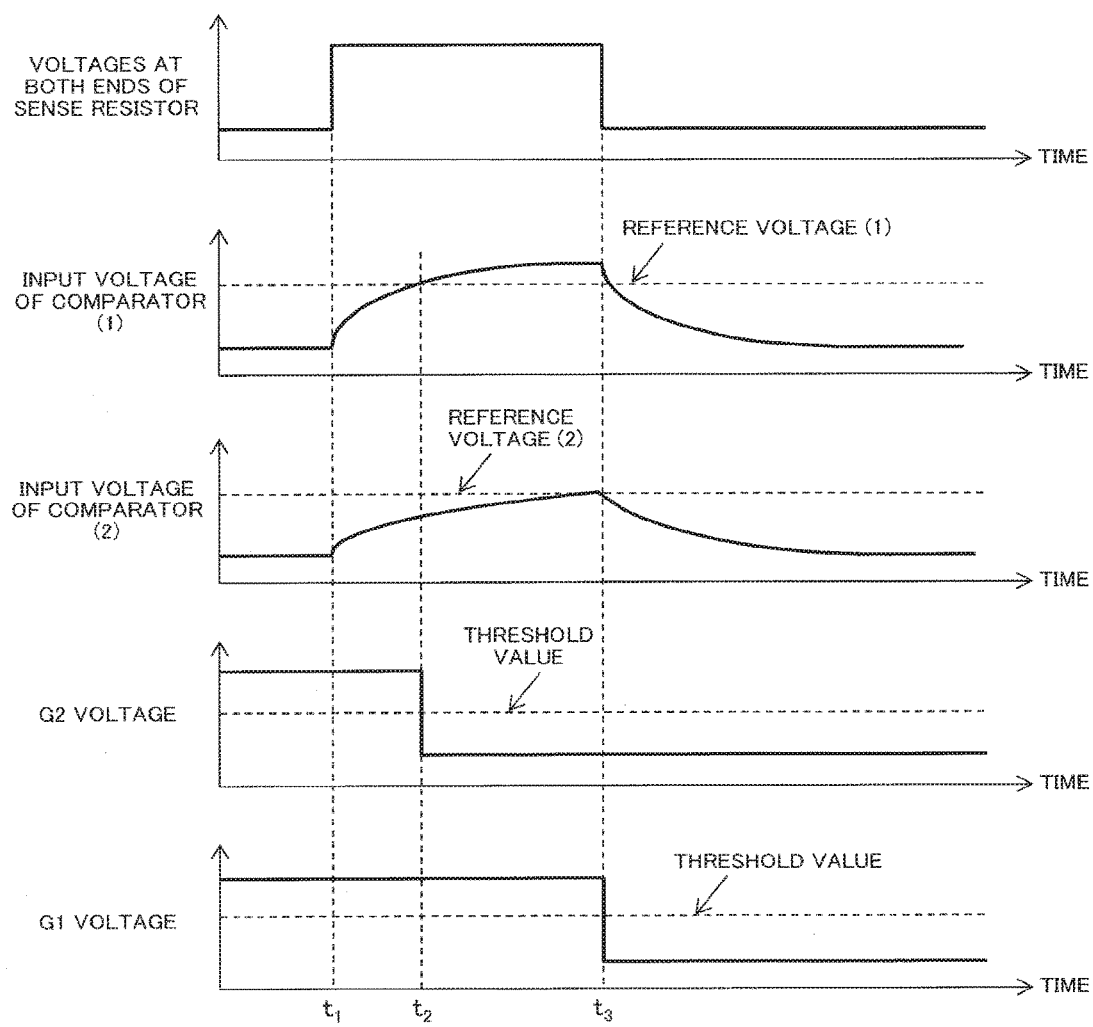
FIG. 2 shows voltage waveforms in correct detection of the first embodiment.

Next, the above-mentioned operation (1) (a case where the overcurrent is detected) will be explained using voltage waveforms in FIG. 2. If the voltages at the both ends of the sense resistor are raised (t1), input voltages of the first comparator 11 and second comparator 14 are raises according to the time constants of the first noise filter 10 and second noise filter 13. The time constant of the second noise filter 13 is larger than the time constant of the first noise filter 10, so that rising inclination of the input voltage of the second comparator 14 becomes gentler relative to the input voltage of the first comparator 11. If the input voltage of the first comparator 11 exceeds the first reference voltage which the reference voltage source 12 generates (t2), the auxiliary gate (G2) 5 is turned off. In this state, though collector current continues to flow, the auxiliary gate (G2) 5 is turned off, so that the saturation current is reduced and heating of the IGBT is suppressed. Then, it the input voltage of the second comparator 14 exceeds the second reference voltage which the reference voltage source 15 generates (t3), the primary gate (G1) 4 is turned off and the IGBT becomes the off-state.

Figure 3:
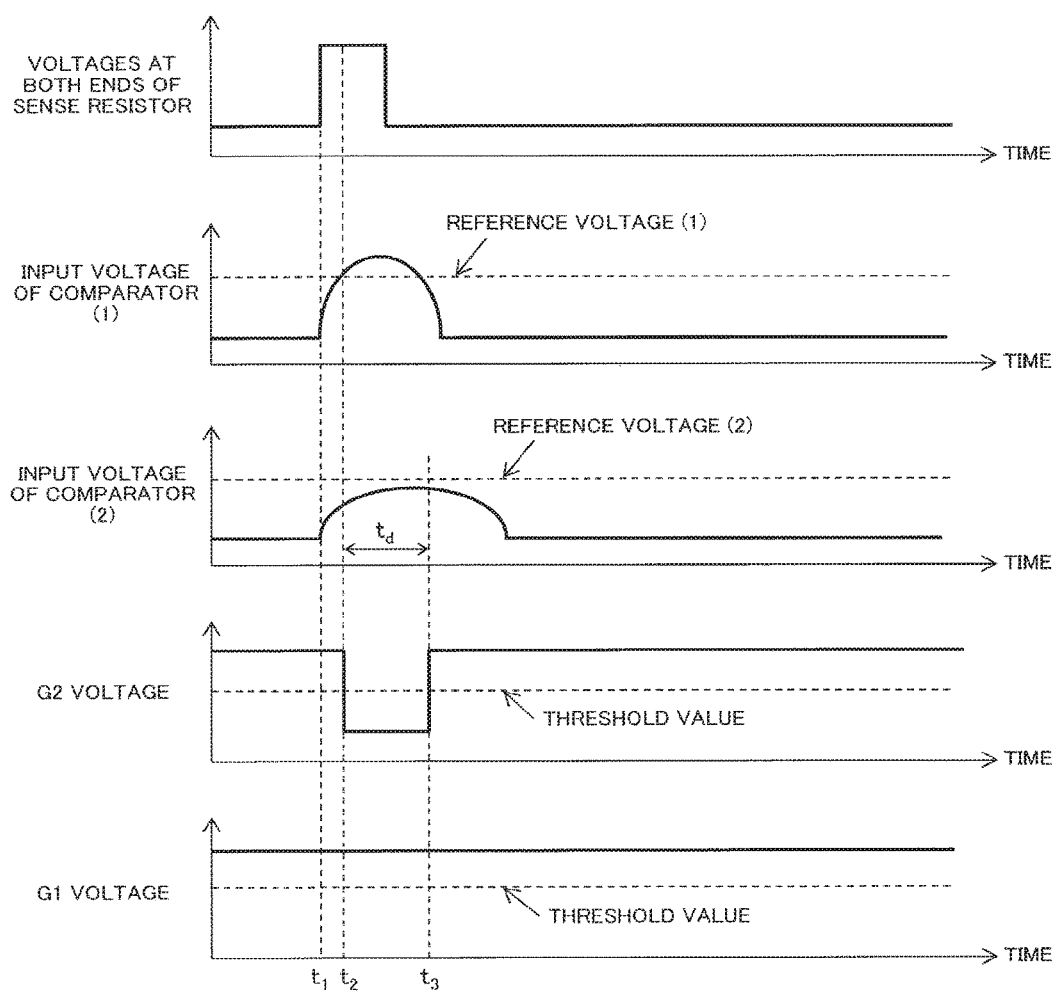
FIG. 3 shows voltage waveform in erroneous detection of the first embodiment.

FIG. 3 shows an operation that corresponds to the above-mentioned operation (2) (a case where the overcurrent is misdetected). When the voltages at the both ends of the sense resistor are raised (t1) and the input voltage of the first comparator exceeds the first reference voltage (t2), the auxiliary gate (G2) 5 is turned off. However, if predetermined time td passes (t3) and the input voltage of the second comparator 14 does not exceed the input voltage of the second comparator 14, the auxiliary gate (G2) 5 is returned to the on-state and the IGBT is returned to the normal on-state (both of the G1 and G2 are in the on-states).

Figure 4:
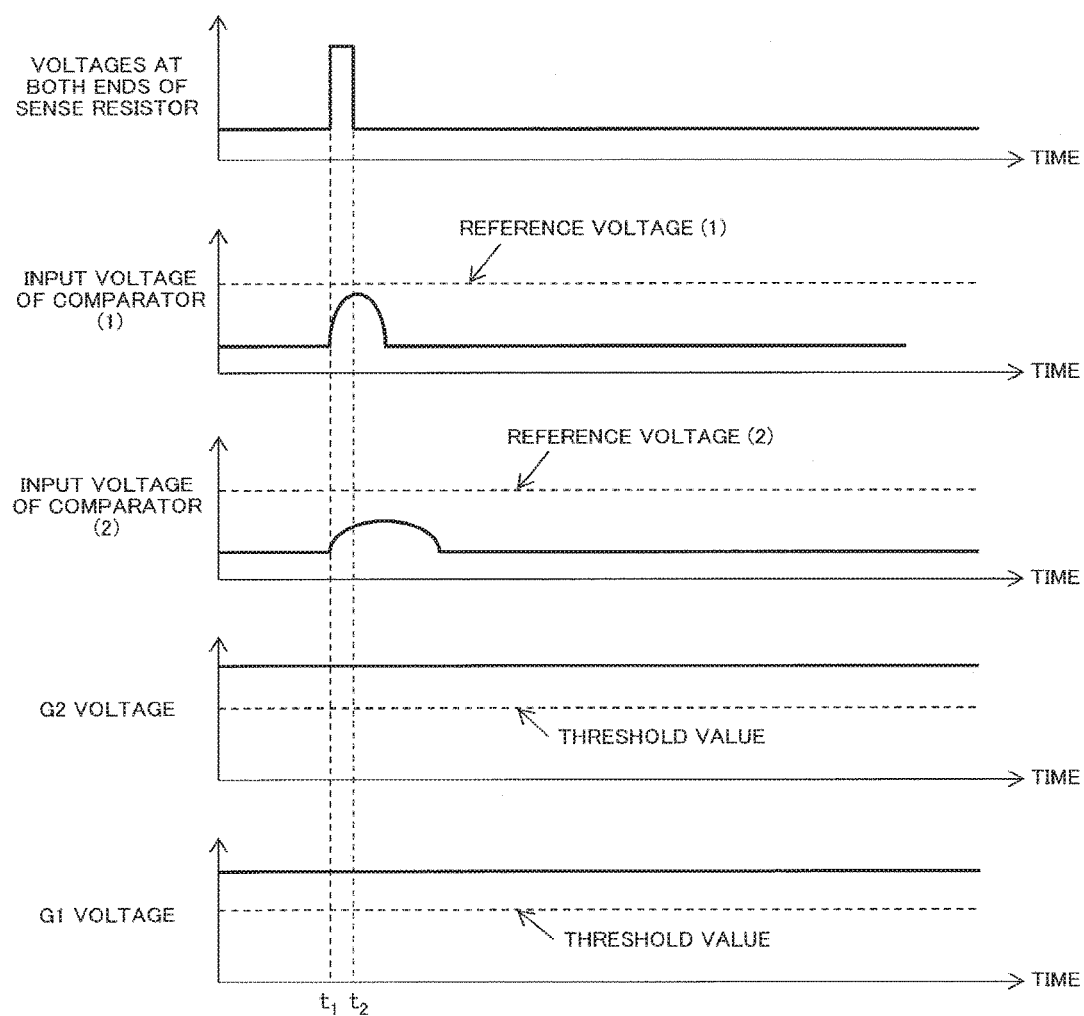
FIG. 4 shows voltage waveform in the erroneous detection of the first embodiment.

FIG. 4 shows an operation that corresponds to the above-mentioned operation (3) (a case where the overcurrent as misdetected). In is operation, though the voltages at the both ends of the sense resistor are raised, the input voltage of the first comparator does not reach the reference voltage, so that the auxiliary gate (G2) keeps the on-state.

Figure 5:
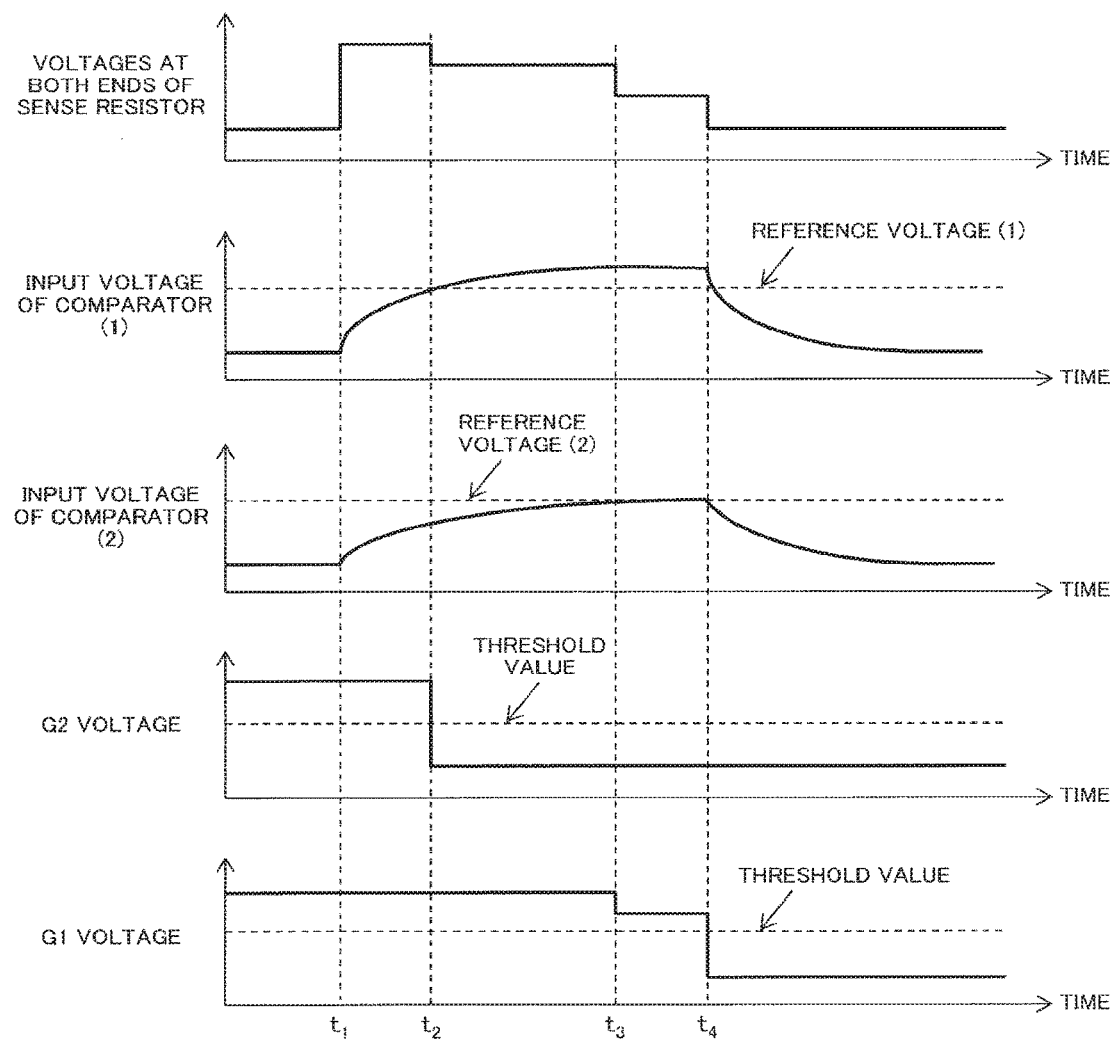
FIG. 5 shows voltage waveform suppressing voltage oscillation of the first embodiment.

In overcurrent protection, short-circuit protection interrupts a large current several times as large as a rated current, so that a surge voltage at the time of interrupting the current braking is large. Using voltage waveforms of FIG. 5, an operation for suppressing the surge voltage in this embodiment is explained. If the input voltage of the first comparator 11 exceeds the first reference voltage (t2), the auxiliary gate (G2) 5 is turned off. At this time, the saturation current is decreased, so that the voltages at the both ends of the sense resistor 9 drop. Next, if the input voltage of the second comparator 14 exceeds the second reference voltage (t3), the primary gate (G1) 4 enters an off-operation. However, the primary gate (G1) 4 is not suddenly turned off and an intermediate voltage (for example, Vg1=10 V) that is larger than a threshold value and smaller than a value in the normal on-state (for example, Vg1=15 V) is maintained (t3 to t4). Then, the primary gate (G1) 4 is turned off (t4). By driving in this way, the saturation current becomes three stages (1. both of the G1 and G2 are in the off-state, 2. the G1 is in the on-state and the G2 is in the off-state, and 3. the G2 is in the off-state and the G1 becomes the intermediate voltage), so that the collector current is gradually reduced and the surge current can be suppressed.

Figure 6:
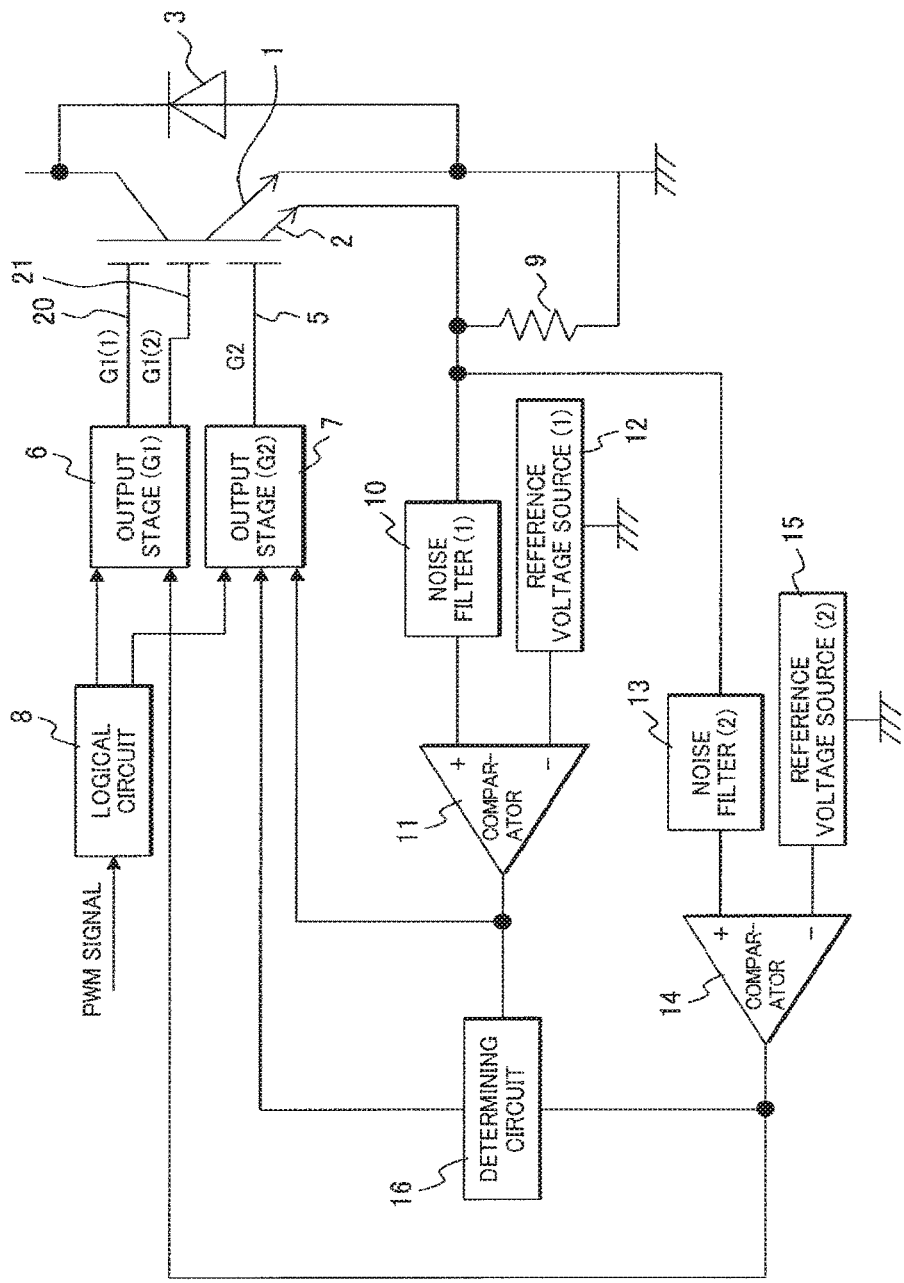
FIG. 6 is a circuit block diagram of a variant of first embodiment.

FIG. 6 shows a circuit block diagram of an apparatus for controlling an insulating gate-type semiconductor element which is a variant of the first embodiment and in which the primary gate (G1) 4 in FIG. 1 is divided into two sections (20 and 21). In a case where the large current is interrupted as in the short-circuit protection, one G1(1) 20 of the primary gate sections is turned off after the auxiliary gate (G2) 5 is turned off and, thereafter, the other G1(2) 21 of the primary gate sections is turned off, whereby the collector current gradually reduces and the surge current is suppressed.

By driving in this way, the saturation current becomes three stages (1. both of the G1 and G2 are in the on-states, 2. the G1(1) is in the off-state and the G1(2) is in the on-state, and 3. both of the G1(1) and G1(2) are in the off-states), so that the collector current gradually reduces and the surge current can be suppressed.

Embodiment 2

Figure 7:
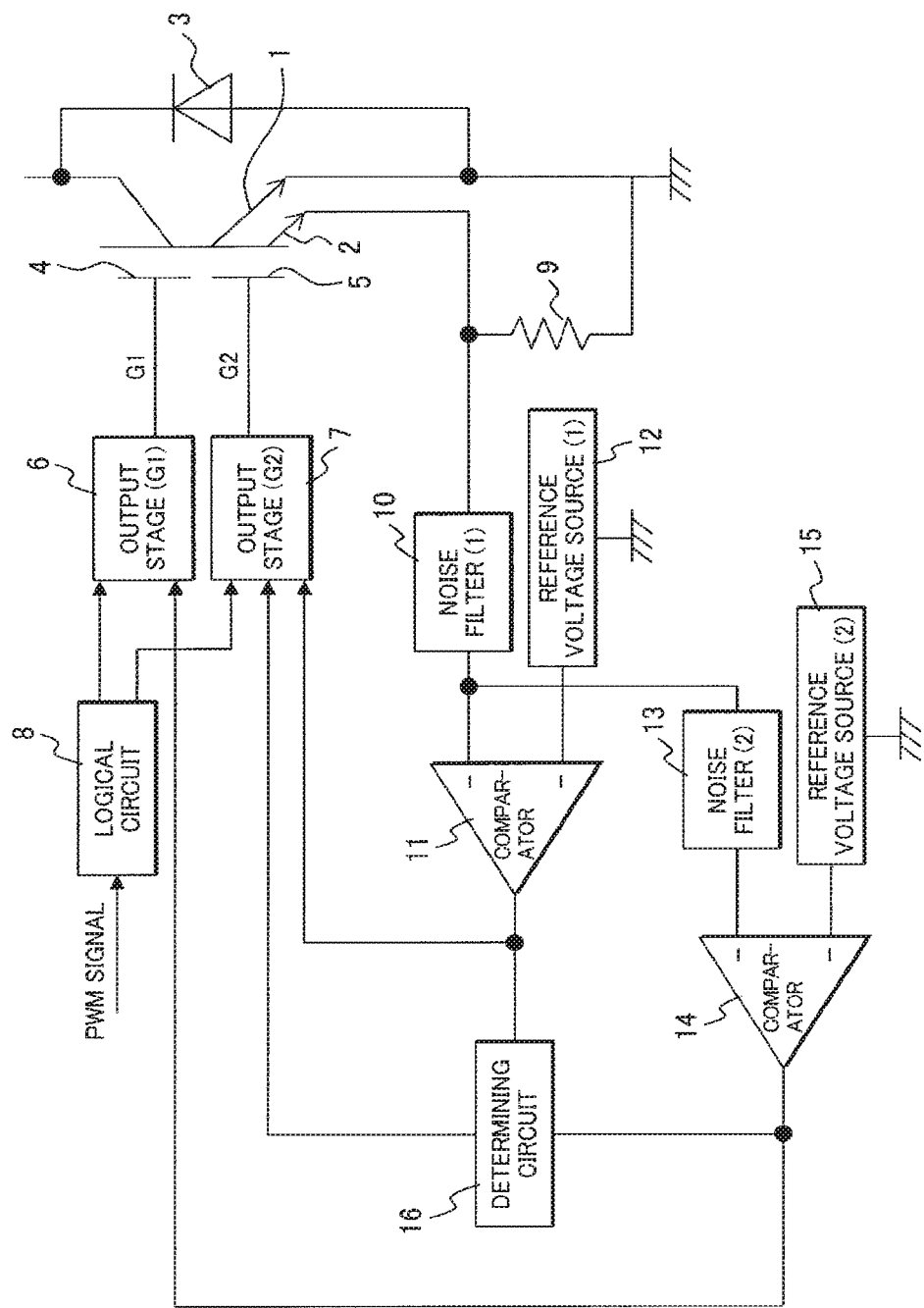
FIG. 7 is a circuit block diagram of an apparatus for controlling an insulating gate-type semiconductor element, according to a second embodiment.

FIG. 7 is a circuit block diagram of an apparatus for controlling an insulating gate-type semiconductor element, according to a second embodiment of the present invention. The difference of this embodiment from the first embodiment lies in that the first noise filter 10 and the second noise filter 13 are connected in series. That is, the voltages at the both ends of the sense resistor 9 are inputted to the second noise filter 13 via the first noise filter 10. In the first embodiment, the first noise filter 10 and the second noise filter 13 are connected in parallel, so that the time constant of the second noise filter 13 is set larger than the time constant of the first noise filter 10. On the contrary, in this embodiment, there is no limitation on the time constants of the first noise filter 10 and second noise filter 13 as in the first embodiment.

In this embodiment, the auxiliary gate (G2) is also turned off at first, whereby the saturation current of the IGBT is reduced and the short-circuit resistance is increased, so that reliability is improved.

Embodiment 3

Figure 8:
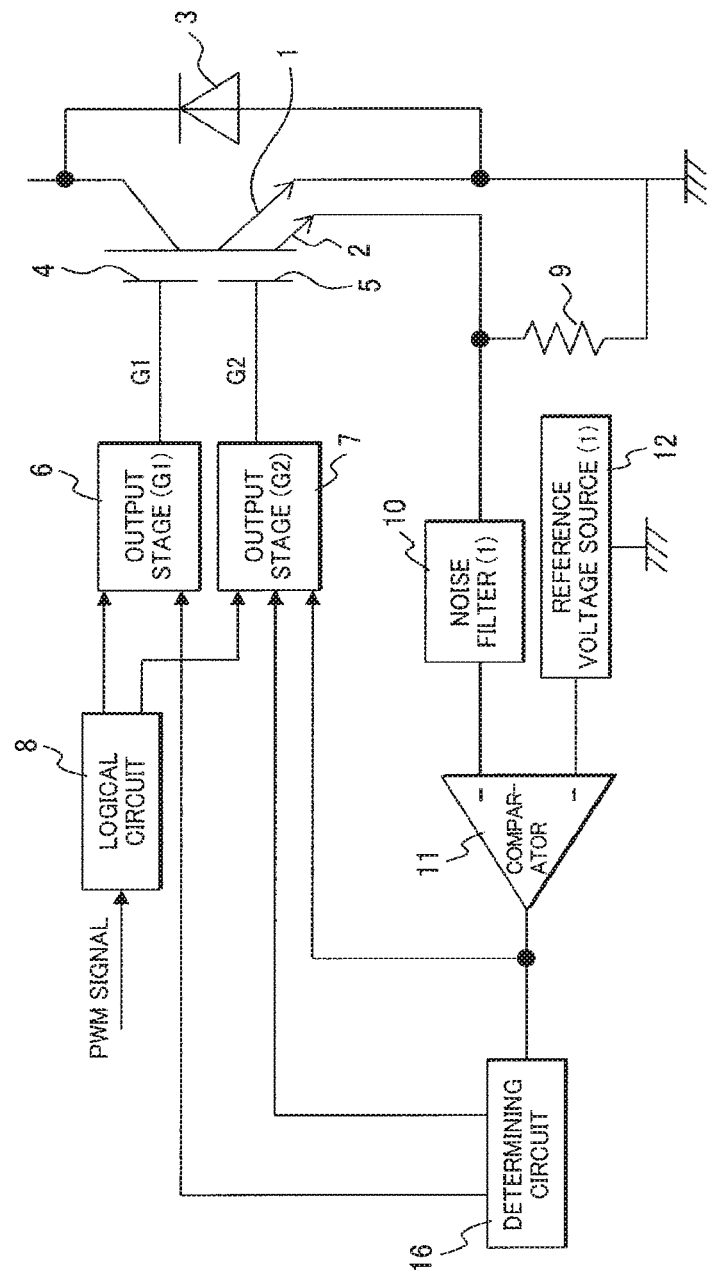
FIG. 8 is a circuit block diagram of an apparatus for controlling an insulating gate-type semiconductor element, according to a third embodiment.

FIG. 8 is a circuit block diagram of an apparatus for controlling an insulating gate-type semiconductor, according to a third embodiment of the present invention. The difference of this embodiment from the first embodiment lies in that the noise filter, the reference voltage source, and the comparator are used one by one.

Next, the operation of this embodiment will be explained with reference to FIGS. 9 to 11.

Figure 9:
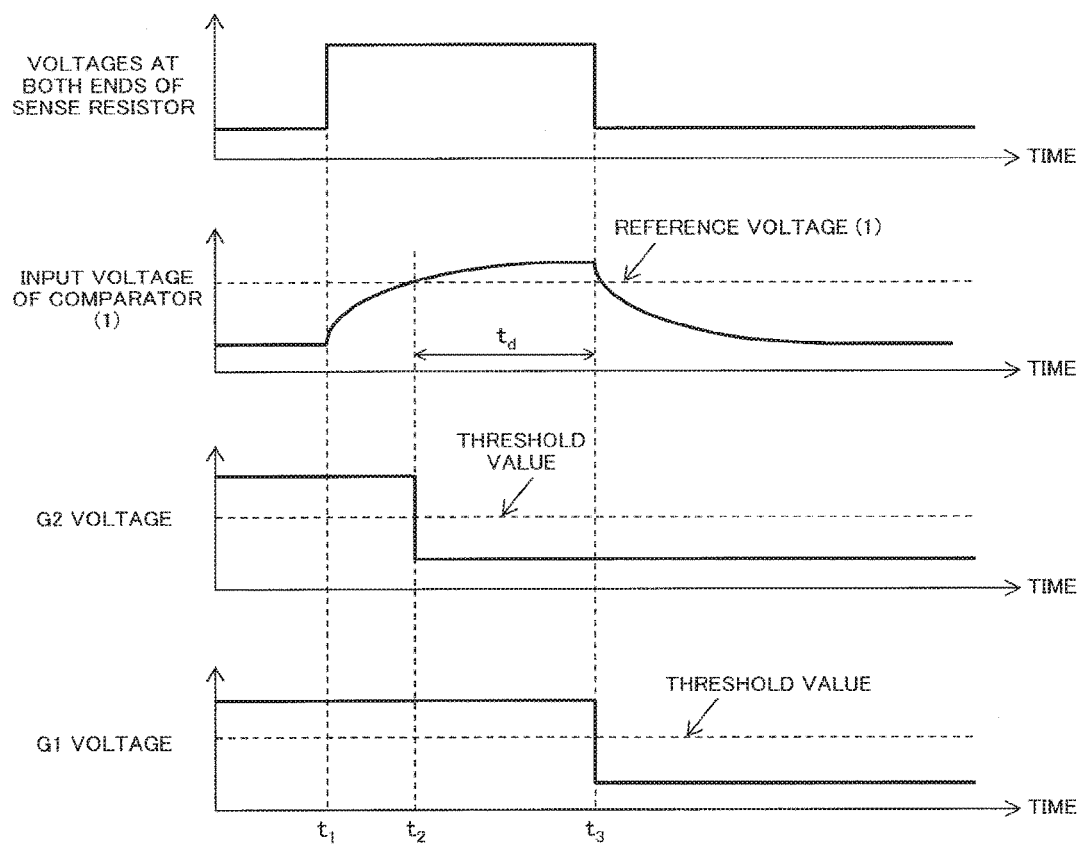
FIG. 9 shows voltage waveforms in correct detection of the second embodiment.

In FIG. 9, if the input voltage of the first comparator exceeds the first reference voltage (t2), the auxiliary gate (G2) is turned off. In this state, the collector current continues to flow. However, the auxiliary gate (G2) is in the off-state, so that the saturation current is reduced and heating of the IGBT is suppressed. Then, if the predetermined time td passes (t3) and the input voltage of the first comparator is kept at a voltage equal to or higher than the reference voltage, the primary gate (G1) is turned off and the IGBT becomes the off-state.

Figure 10:
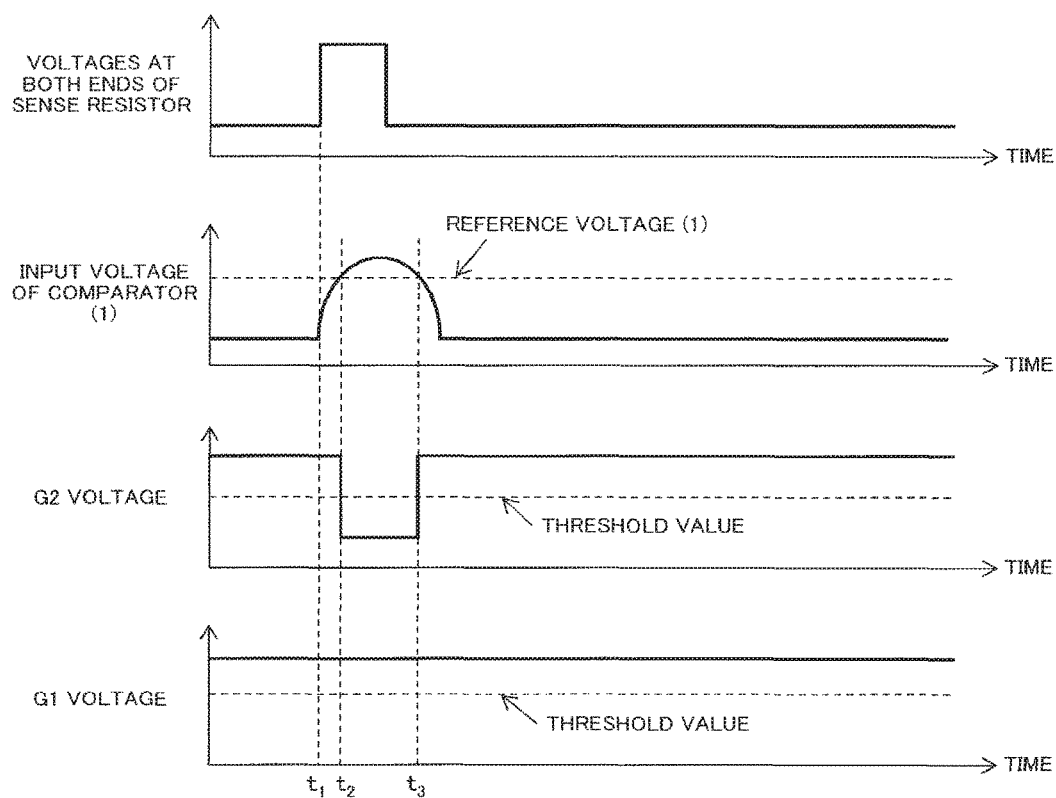
FIG. 10 shows voltage waveform in erroneous detection of the second embodiment.

In FIG. 10, if the input voltage of the first comparator exceeds the first reference voltage (t2), the auxiliary gate (G2) is turned off. If the input voltage of the first comparator is reduced to a voltage equal to or lower than the reference voltage (t3) before the time td passes, the auxiliary gate (G2) is returned to the on-state.

Figure 11:
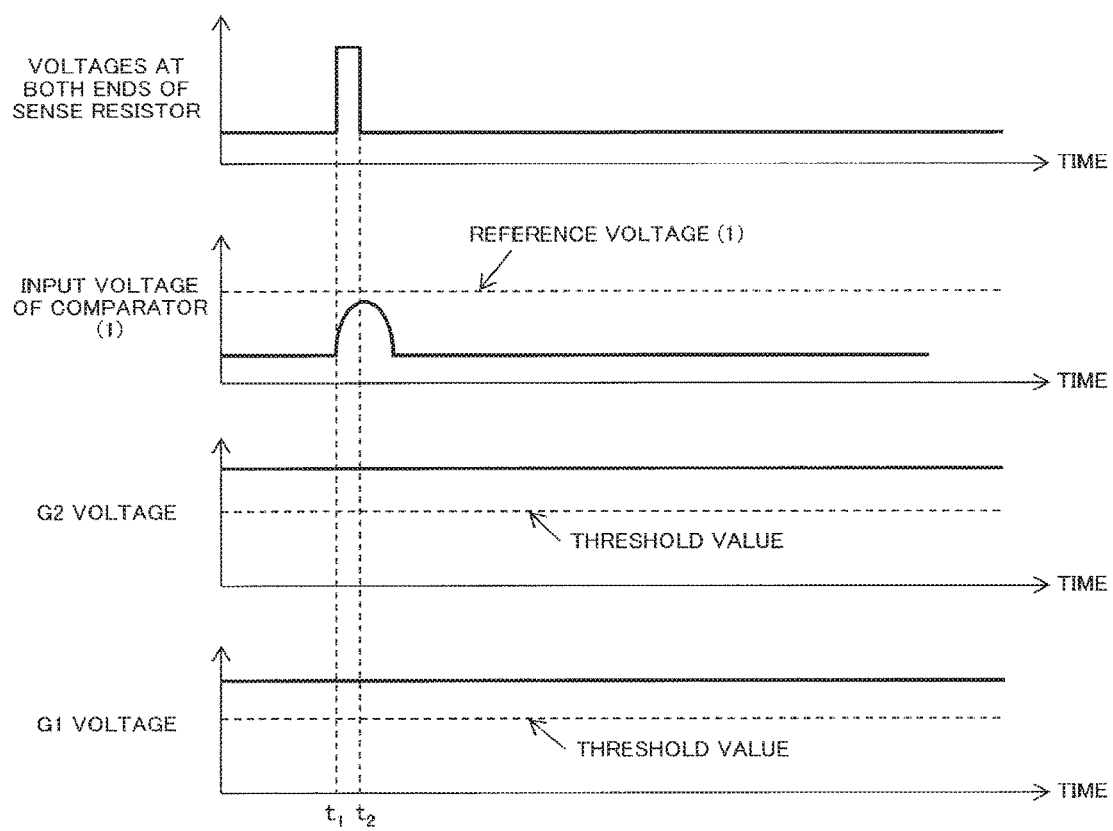
FIG. 11 shows voltage waveform in the erroneous detection of the second embodiment.

In FIG. 11, the input voltage of the first comparator does not reach the reference voltage, so that the auxiliary gate (G2) keeps the on-state.

In this embodiment, the auxiliary gate (G2) is also turned off at first, whereby the saturation current of the IGBT is reduced and the short-circuit resistance is increased, so that reliability is improved.

Embodiment 4

Figure 12:
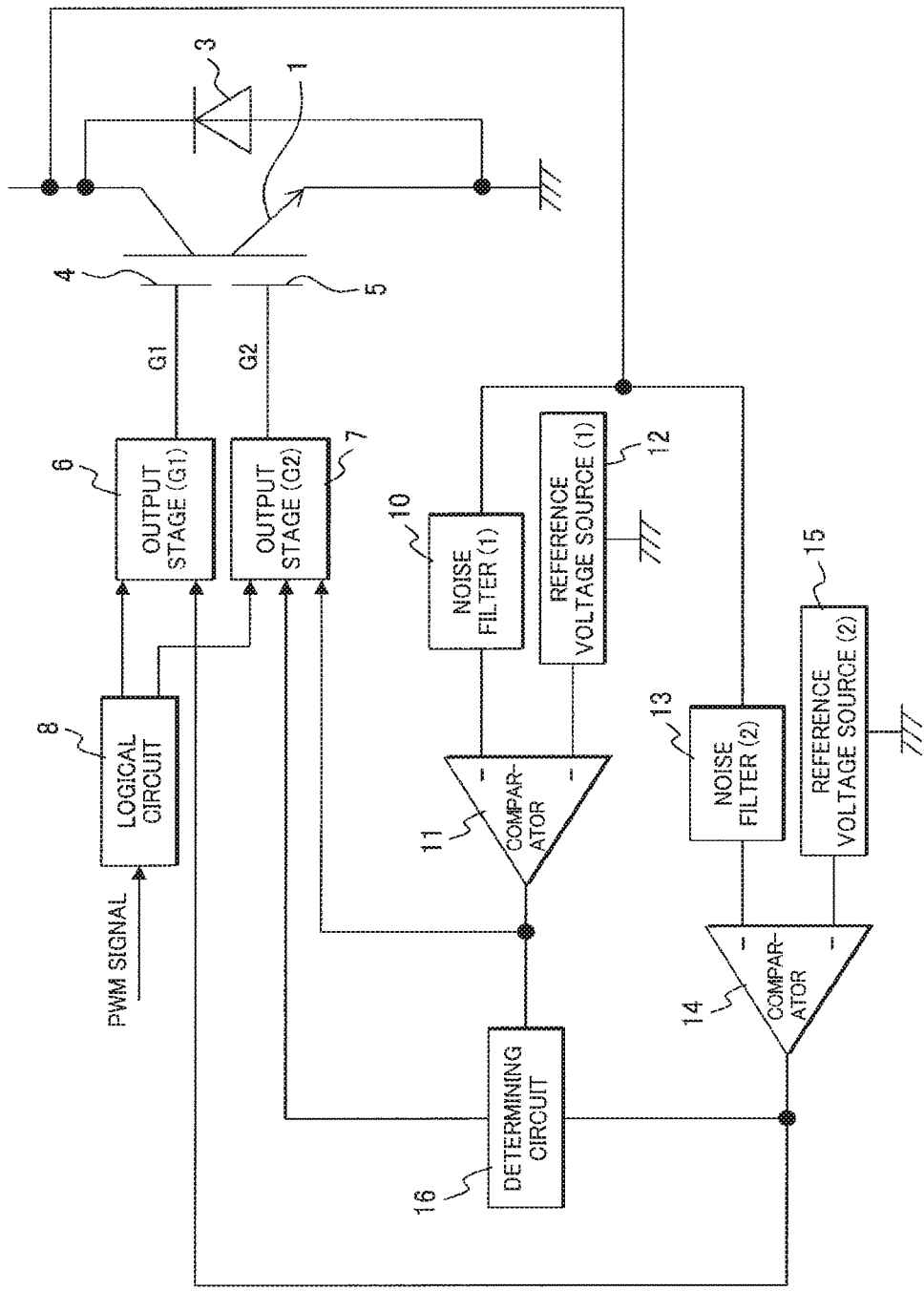
FIG. 12 is a circuit block diagram of an apparatus for controlling an insulating gate type semiconductor element, according to a fourth embodiment.

FIG. 12 is a circuit block diameter of an apparatus for controlling an insulating gate-type semiconductor element, according to a fourth embodiment of the present invention. The difference of this embodiment from the first embodiment lies in that means to detect a collector voltage is employed as means to detect the collector current. There is positive correlation between the collector current and the collector voltage, so that it is possible to estimate the collector current by detecting the collector voltage. If the collector voltage is raised and the output of the first noise filter 10 exceeds the reference voltage of the first reference voltage source 12, the auxiliary gate (G2) 5 is turned off. Then, if the output of the second noise filter 13 exceeds the reference voltage of the second reference voltage source 15, the primary gate (G1) 4 is turned off and the IGBT 1 is turned off.

In this embodiment, the auxiliary gate (G2) is also turned off at first, whereby the saturation current of the IGBT 1 is reduced and the short-circuit resistance is increased, so that reliability is improved.

Embodiment 5

Figure 13:
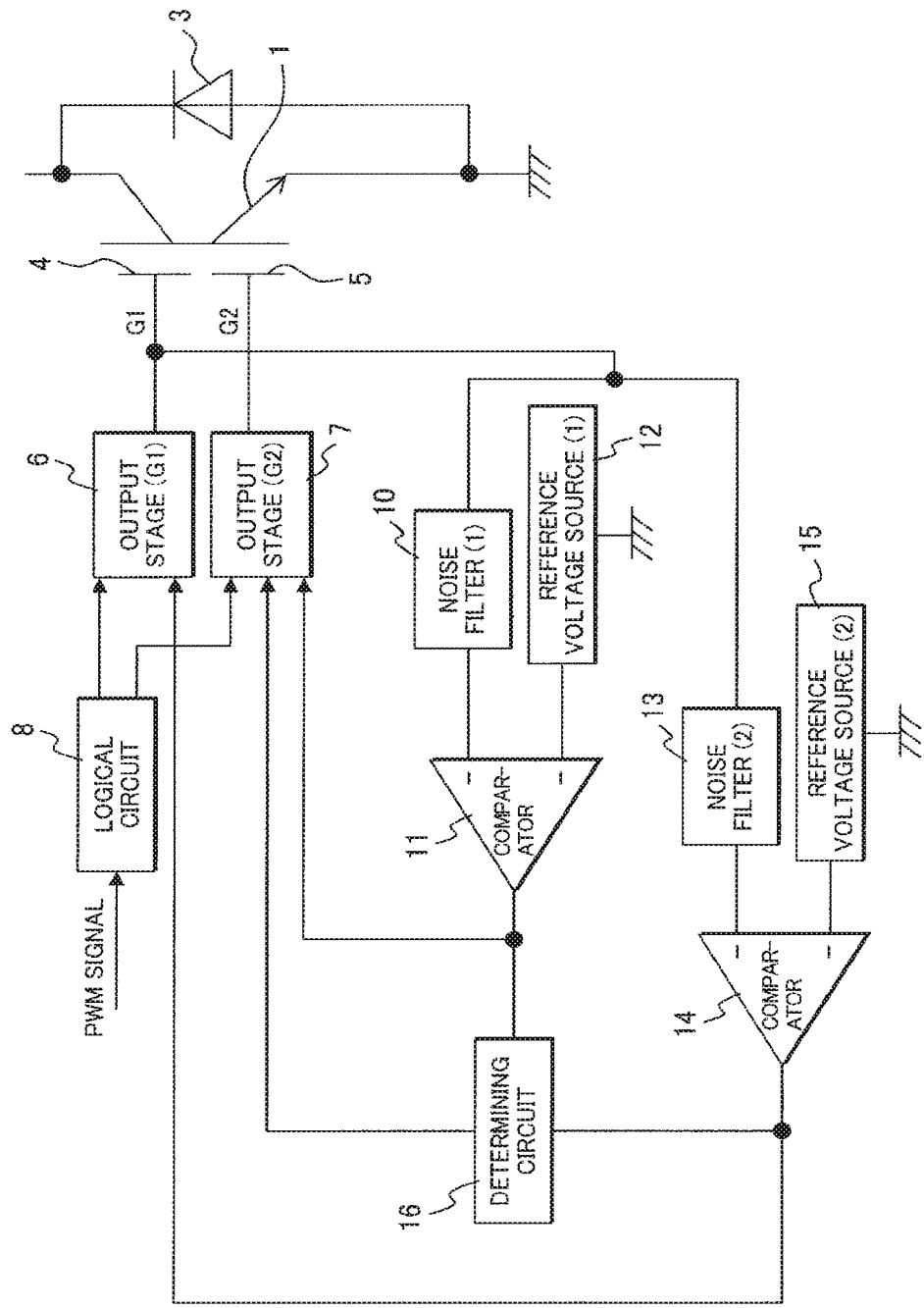
FIG. 13 is a circuit block diagram of an apparatus for controlling an insulating gate-type semiconductor element, according to a fifth embodiment.

FIG. 13 is a circuit block diagram of an apparatus for controlling an insulting gate-type semiconductor element, according to a fifth embodiment of the present invention. The difference of this embodiment from the first embodiment lies in that means to detect a gate voltage is employed as means to detect the collector current. If the collector current is raised and the collector voltage is increased, the gate voltage is raised via feedback capacitance, so that it is possible to estimate the collector current by detecting the gate voltage.

If the gate voltage is raised and the output of the first noise filter 10 exceeds the first reference voltage of the reference voltage source 12, the auxiliary gate (G2) 5 is turned off. Then, if the output of the second noise filter 13 exceeds the second reference voltage of the reference voltage source 15, the primary gate (G1) 4 turned off and the IGBT is turned off.

In this embodiment, the auxiliary gate (G2) is turned off at first, whereby the saturation current of the IGBT is reduced and the short-circuit resistance is increased, so that reliability is improved.

Embodiment 6

Figure 14:
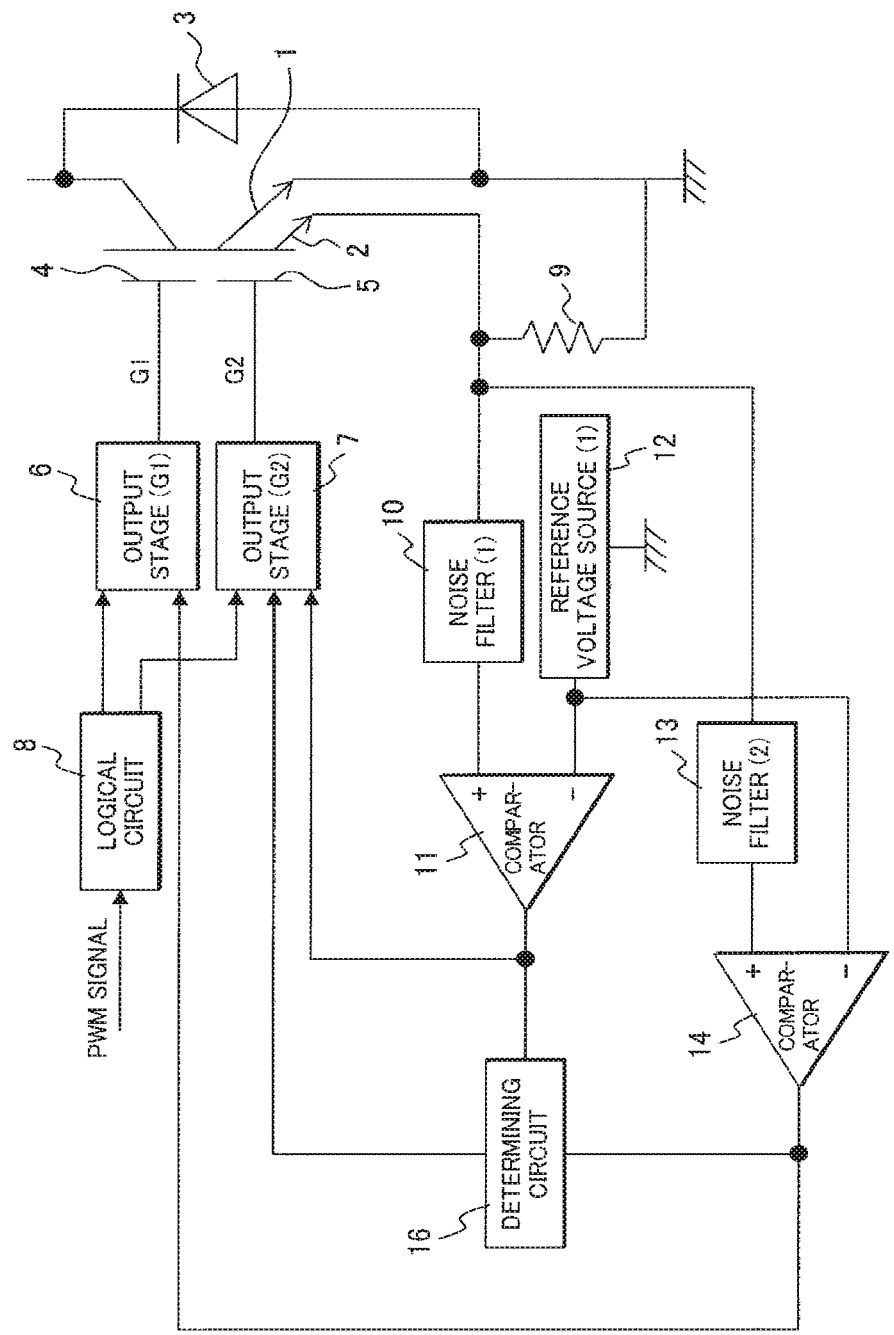
FIG. 14 is a circuit block diagram of an apparatus for controlling an insulating gate-type semiconductor element, according to a sixth embodiment.

FIG. 14 is a circuit block diagram of an apparatus for controlling an insulating gate-type semiconductor element, according to a sixth embodiment of the present invention. The difference of this embodiment from the first embodiment lies in that the reference voltages are supplied to the first comparator 11 and the second comparator 14 by the same reference voltage source 12. Therefore, in this embodiment, the reference voltages of the first comparator 11 and second comparator 14 become the same value.

If the overcurrent flows, voltages are generated at the both ends of the sense resistor 9, and the output of the first noise filter 10 exceeds the reference voltage of the reference voltage source 12, the auxiliary gate (G2) 5 is turned off. Then, if the output of the second noise filter 13 exceeds the reference voltage of the same reference voltage source 12, the primary gate (G1) 4 is turned off and the IGBT is turned off.

In this embodiment, the auxiliary gate (G2) is turned off at first, whereby the saturation current is reduced and the short-circuit resistance is increased, so that reliability is improved.

Embodiment 7

Figure 15:
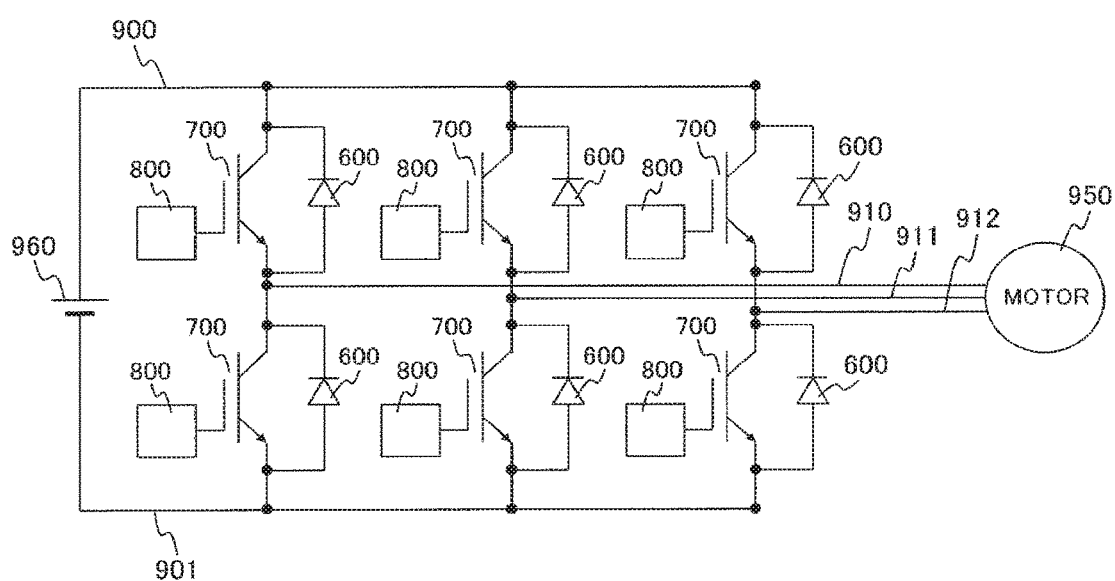
FIG. 15 is a circuit configuration diagram of a power conversion apparatus according to a seventh embodiment.

FIG. 15 shows a circuit configuration view of a power conversion apparatus according to a seventh embodiment of the present invention.

This embodiment is a three-phase inverter apparatus and employs, as a semiconductor switching element 700, the insulating gate-type semiconductor element provided with the plurality of insulating gates that are explained in the above-mentioned embodiments. Incidentally, in FIG. 15, circuit symbols for a general IGBT is employed for convenience as circuit symbols for the semiconductor switching element.

This embodiment is provided with a pair of direct current terminals 900 and 901, and alternating current terminals, the number of which is equal to the phase number of an alternating current, viz., three alternating current terminals 910, 911, and 912. Between each direct current terminal and each alternating current terminal, one semiconductor switching element 700 is connected, and the three-phase inverter apparatus is provided with six semiconductor switching elements as a whole. Moreover, a diode 600 is connected to each semiconductor switching element 700 in reverse parallel. Incidentally, the number of the semiconductor switching elements 700 and diodes 600 is suitably increased according to the phase number of the alternating current, the electric power capacity of the power conversion apparatus, and the resistance and current capacity of the semiconductor switching element 700 by itself.

Each semiconductor switching element 700 is on-driven and off-driven by a gate drive circuit 800, whereby DC power that is received by the direct current terminals 900 and 901 from a DC power source 960 is converted into AC power which is outputted from the alternating current terminals 910, 911, and 912. Each alternating current output terminal is connected to a motor 950 for an induction machine, a synchronous machine or the like, which is rotation-driven by the AD power that is outputted from each alternating current terminal.

Moreover, in this embodiment, the gate drive circuit 800 is provided with the control apparatus for any of the above-mentioned embodiments. Thereby, if arm short circuit or the like occurs, the semiconductor switching element 700 is safely turned off and is protected from the overcurrent. Therefore, the reliability of the power conversion apparatus is improved.

Though this embodiment is the inverter apparatus, the control apparatus according to the present invention can be also applied to other power conversion apparatuses, such as convertors and choppers, with respect to gate drive circuits of semiconductor switching elements, by which the same effect is obtained.

Incidentally, the present invention is not limited to the above-mentioned embodiments. It goes without saying that various changes are possible within the scope of the technical idea of the present invention.

REFERENCE SIGNS LIST

1 . . . IGBT
2 . . . Sense IGBT,
3 . . . Diode,
4 . . . Primary gate (G1),
5 . . . Auxiliary gate (G2),
6 . . . Output stage of G1 drive circuit,
7 . . . Output stage of G2 drive circuit,
8 . . . Logical circuit,
9 . . . Sense resistor,
10 . . . First noise filter,
11 . . . First Comparator,
12 . . . First reference voltage source,
13 . . . Second noise filter,
14 . . . Second comparator,
15 . . . Second reference voltage source, 16 . . . Determining circuit,
600 . . . Diode,
700 . . . Semiconductor switching element,
800 . . . Gate drive circuit,
900, 901 . . . Direct current terminal,
910, 911, 912 . . . Alternating current terminal,
950 . . . Motor,
960 . . . DC power source.

The invention claimed is:

1. An apparatus for controlling an insulating gate-type semiconductor element provided with a first insulating gate and a second insulating gate, the apparatus being adapted to drive the insulating gate-type semiconductor element by a first control voltage and a second control voltage that are supplied to the first insulating gate and the second insulating gate, respectively, and comprising:
   a current detector comprising a sensing portion of the insulating gate-type semiconductor element, the sensing portion including a voltage detector to detect at least either one of a collector voltage and a first insulating gate voltage of the insulating gate-type semiconductor element, and the current detector outputting a signal about current that passes through the insulating gate-type semiconductor element;
   a first noise filter inputting the signal which the current detector outputs;
   a first comparator making a comparison between an output signal of the first noise filter and an output signal of a first reference voltage source and outputting a first comparison result;
   a second noise filter inputting the signal which the current detector outputs;
   a second comparator making a comparison between an output signal of the second noise filter and an output signal of a second reference voltage source and outputting a second comparison result;
   a first control voltage output circuit; and
   a second control voltage output circuit,
   wherein the first control voltage output circuit is adapted to reduce the first control voltage after the second control voltage is reduced,
   wherein the second control voltage output circuit is adapted to reduce the second control voltage when it is determined from the first comparison result that overcurrent passes through the insulating gate-type semiconductor element, and
   wherein the second control voltage output circuit is adapted to reduce the second control voltage when it is determined from the second comparison result that the overcurrent passes through the insulating gate-type semiconductor element.

2. The apparatus for controlling the insulating gate-type semiconductor element, according to claim 1,
   wherein a time constant of the second noise filter is larger than a time constant of the first noise filter.

3. The apparatus for controlling the insulating gate-type semiconductor element, according to claim 1,
   wherein if it is determined from the first comparison result that the overcurrent passes through the insulating gate-type semiconductor element and unless it is determined from the second comparison result that the overcurrent passes through the insulating gate-type semiconductor element, the second control voltage output circuit is adapted to increase the second control voltage.

4. The apparatus for controlling the insulating gate-type semiconductor element, according to claim 1,
   wherein the first control voltage output circuit is adapted to step-wise reduce the first control voltage.

5. The apparatus for controlling the insulating gate-type semiconductor element, according to claim 1,
   wherein the first insulating gate comprises a first section and a second section, and
   wherein the first control voltage that is supplied to the first section is reduced earlier than the first control voltage that is supplied to the second section.

6. The apparatus for controlling the insulating gate-type semiconductor element, according to claim 1,
   wherein the signal which the current detector outputs is inputted to the second noise filter via the first noise filter.

7. The apparatus for controlling the insulating gate-type semiconductor element, according to claim 1,
   wherein the first control voltage output circuit is adapted to reduce the first control voltage if it is determined from the first comparison result that the overcurrent passes through the insulating gate-type semiconductor element during a predetermined time.

8. The apparatus for controlling the insulating gate-type semiconductor element, according to claim 7,
   wherein the second control voltage output circuit is adapted to increase the second control voltage if it is determined that the overcurrent passes through the insulating gate-type semiconductor element during time shorter than the predetermined time.

9. The apparatus for controlling the insulating gate-type semiconductor element, according to claim 1,
   wherein the current detector is adapted to output the signal about the current passing through the insulating gate-type semiconductor element, on the basis of the collector voltage of the insulating gate-type semiconductor element.

10. The apparatus for controlling the insulating gate-type semiconductor element, according to claim 1,
    wherein the current detector is adapted to output the signal about the current passing through the insulating gate-type semiconductor element, on the basis of the first insulating gate voltage of the insulating gate-type semiconductor element.

11. The apparatus for controlling the insulating gate-type semiconductor element, according to claim 1,
    wherein a magnitude of the output signal of the first reference voltage source and a magnitude of the output signal of the second reference voltage source are the same.

12. A power conversion apparatus comprising:
    a pair of direct current terminals;
    alternating current terminals, the number of which is equal to the phase number of an alternating current;
    a plurality of semiconductor switching elements disposed between the direct current terminals and the alternating current terminals;
    a plurality of diodes connected to the plurality of semiconductor switching elements in reverse parallel; and
    a plurality of gate drive apparatuses driving the plurality of semiconductor switching elements,
    wherein each of the plurality of semiconductor switching elements is an insulating gate-type semiconductor element provided with a first insulating gate and a second insulating gate, and
    wherein each of the plurality of gate drive apparatuses is provided with the apparatus for controlling the insulating gate-type semiconductor element, according to claim 1.

13. The power conversion apparatus, according to claim 12,
   wherein a time constant of the second noise filter is larger than a time constant of the first noise filter.

14. The power conversion apparatus, according to claim 12,
   wherein if it is determined from the first comparison result that the overcurrent passes through the insulating gate-type semiconductor element and unless it is determined from the second comparison result that the overcurrent passes through the insulating gate-type semiconductor element, the second control voltage output circuit is adapted to increase the second control voltage.

15. The power conversion apparatus, according to claim 12,
   wherein the first control voltage output circuit is adapted to step-wise reduce the first control voltage.

16. The power conversion apparatus, according to claim 12,
   wherein the first insulating gate comprises a first section and a second section, and
   wherein the first control voltage that is supplied to the first section is reduced earlier than the first control voltage that is supplied to the second section.

17. The power conversion apparatus, according to claim 12,
   wherein the signal which the current detector outputs is inputted to the second noise filter via the first noise filter.

18. The power conversion apparatus, according to claim 12,
   wherein the first control voltage output circuit is adapted to reduce the first control voltage if it is determined from the first comparison result that the overcurrent passes through the insulating gate-type semiconductor element during a predetermined time.

19. The power conversion apparatus, according to claim 12,
   wherein the current detector is adapted to output the signal about the current passing through the insulating gate-type semiconductor element, on the basis of the collector voltage of the insulating gate-type semiconductor element.

20. The power conversion apparatus, according to claim 12,
   wherein the current detector is adapted to output the signal about the current passing through the insulating gate-type semiconductor element, on the basis of the first insulating gate voltage of the insulating gate-type semiconductor element.

\* \* \* \* \*